US012625424B2

(12) United States Patent
Han et al.

(10) Patent No.: US 12,625,424 B2
(45) Date of Patent: May 12, 2026

(54) METHOD OF ANNEALING REFLECTIVE PHOTOMASK BY USING LASER

(71) Applicant: Samsung Electronics Co., Ltd., Suwon-si (KR)

(72) Inventors: Hakseung Han, Hwaseong-si (KR); Sanguk Park, Yongin-si (KR); Jongju Park, Hwaseong-si (KR); Raewon Yi, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 18/441,665

(22) Filed: Feb. 14, 2024

(65) Prior Publication Data

US 2024/0184192 A1 Jun. 6, 2024

Related U.S. Application Data

(63) Continuation of application No. 18/048,949, filed on Oct. 24, 2022, now Pat. No. 11,934,092, which is a
(Continued)

(30) Foreign Application Priority Data

Jan. 22, 2020 (KR) ........................ 10-2020-0008564

(51) Int. Cl.
| | |
|---|---|
| *G03F 1/24* | (2012.01) |
| *B23K 26/06* | (2014.01) |
| *H10P 34/42* | (2026.01) |

(52) U.S. Cl.
CPC ................ *G03F 1/24* (2013.01); *B23K 26/06* (2013.01); *H10P 34/42* (2026.01)

(58) Field of Classification Search
CPC ... H01L 21/268; B23K 26/06; B23K 26/0643; B23K 26/0648; B23K 26/0661; G03F 1/24; G03F 1/50; G03F 1/52; G03F 1/68
See application file for complete search history.

(56) References Cited

U.S. PATENT DOCUMENTS

| | | |
|---|---|---|
| 6,469,455 B1 | 10/2002 | Inoue |
| 6,645,679 B1 | 11/2003 | La Fontaine et al. |
| | (Continued) | |

FOREIGN PATENT DOCUMENTS

| | | |
|---|---|---|
| JP | 2003124136 A | 4/2003 |
| JP | 2004-061915 A | 2/2004 |
| | (Continued) | |

*Primary Examiner* — Brook Kebede
(74) *Attorney, Agent, or Firm* — Wolf, Greenfield & Sacks, P.C.

(57) ABSTRACT

A laser annealing method performed on a reflective photomask may include preparing a reflective photomask including a pattern area and a border area surrounding the pattern area and irradiating a laser beam onto the border area of the reflective photomask. The irradiating of the laser beam may include split-irradiating a plurality of laser beam spots onto the border area. Each of the plurality of laser beam spots may be shaped using a beam shaper. The beam shaper may include a blind area, a transparent area at a center of the blind area, and a semitransparent area between the blind area and the transparent area. Each of the plurality of laser beam spots may include a center portion passing through the transparent area and having a uniform energy profile and an edge portion passing through the semitransparent area and having an inclined energy profile.

19 Claims, 14 Drawing Sheets

Related U.S. Application Data continuation of application No. 16/911,601, filed on Jun. 25, 2020, now Pat. No. 11,506,968.

(56)           References Cited

U.S. PATENT DOCUMENTS

| | | | |
|---|---|---|---|
| 9,466,490 B2 | 10/2016 | Kim et al. | |
| 10,353,208 B2 | 7/2019 | Anikitchev | |
| 10,353,295 B2 | 7/2019 | Dmitriev et al. | |
| 11,506,968 B2 | 11/2022 | Han et al. | |
| 2002/0021723 A1* | 2/2002 | Amako | B23K 26/0604 |
| | | | 359/566 |
| 2003/0068836 A1 | 4/2003 | Hongo et al. | |
| 2005/0169330 A1 | 8/2005 | Hongo et al. | |
| 2006/0003478 A1 | 1/2006 | Hongo et al. | |
| 2008/0090396 A1 | 4/2008 | Ohnuma | |
| 2008/0121894 A1 | 5/2008 | Hongo et al. | |
| 2011/0275013 A1* | 11/2011 | Lee | B82Y 10/00 |
| | | | 430/5 |
| 2013/0029253 A1 | 1/2013 | Mangat et al. | |
| 2013/0288166 A1 | 10/2013 | Lee et al. | |
| 2014/0076867 A1* | 3/2014 | Kim | G02B 27/0927 |
| | | | 219/121.73 |
| 2014/0212795 A1 | 7/2014 | Tanabe et al. | |
| 2016/0370697 A1 | 12/2016 | Oshemkov et al. | |

FOREIGN PATENT DOCUMENTS

| | | |
|---|---|---|
| JP | 2008-112985 A | 5/2008 |
| JP | 2016134542 A | 7/2016 |
| JP | 2017072722 A | 4/2017 |
| KR | 20060029040 A | 4/2006 |
| KR | 100703111 B1 | 4/2007 |
| KR | 10-2011-0122928 A | 11/2011 |
| KR | 10-2014-0043950 A | 4/2014 |

* cited by examiner

230A

230B 230A, 230B 230A, 230B 230A, 230B 230A, 230B 230A, 230B

METHOD OF ANNEALING REFLECTIVE PHOTOMASK BY USING LASER

CROSS-REFERENCE TO THE RELATED APPLICATION

This application is a continuation of U.S. patent application Ser. No. 18/048,949, filed Oct. 24, 2022, which is a continuation of U.S. patent application Ser. No. 16/911,601, filed Jun. 25, 2020, which application claims priority from Korean Patent Application No. 10-2020-0008564, filed on Jan. 22, 2020, in the Korean Intellectual Property Office, the disclosures of which are incorporated herein by reference in their entireties.

BACKGROUND

The inventive concept relates to a method of lowering a reflectance of a reflective photomask by using a laser annealing method and a laser annealing apparatus.

A border area of a reflective photomask is an area where forming of a pattern is forbidden. Therefore, the border area should have a sufficiently low reflectance, and thus, should not reflect light. A laser annealing method has been proposed for lowering a reflectance of the border area. However, in a general laser annealing method, a very gentle slope occurs in an edge area of the border area, and due to this, a forbidden area is unnecessarily widened. Therefore, in a case which uses a very short pulsed laser, a very steep slope occurs in the edge area of the border area, and due to this, a reflection layer and/or an absorption layer are/is physically damaged (e.g., cracked).

SUMMARY

The example embodiments of the disclosure provide a method of annealing a border area of a reflective photomask by using a laser.

The example embodiments of the disclosure provide a laser annealing method for adjusting a slope of an edge area of a border area.

The example embodiments of the disclosure provide a laser annealing apparatus.

Various objects of the disclosure will be described in detail in the detailed description.

A method of annealing a reflective photomask by using a laser in accordance with an embodiment of the disclosure may include preparing a reflective photomask including a pattern area and a border area surrounding the pattern area and irradiating a laser beam onto the border area of the reflective photomask. The irradiating of the laser beam may include split-irradiating a plurality of laser beam spots onto the border area. Each of the plurality of laser beam spots may be shaped using a beam shaper. The beam shaper may include a blind area, a transparent area at a center of the blind area, and a semitransparent area between the blind area and the transparent area. Each of the plurality of laser beam spots may include a center portion passing through the transparent area and having a uniform energy profile and an edge portion passing through the semitransparent area and having an inclined energy profile that increases from an outer edge of the edge portion toward the center portion.

A method of annealing a reflective photomask by using a laser in accordance with an embodiment of the disclosure may include preparing a reflective photomask including a pattern area, a non-pattern area surrounding the pattern area, and a border area between the pattern area and the non-pattern area and irradiating a laser beam onto the border area of the reflective photomask to recess the border area. The irradiating of the laser beam may include split-irradiating a plurality of laser beam spots onto the border area. Each of the plurality of laser beam spots may include a center portion where transmittance is not adjusted and an edge portion where transmittance is adjusted.

A method of annealing a reflective photomask by using a laser in accordance with an embodiment of the disclosure may include placing a reflective photomask on a stage, generating, by a laser source, a laser beam to irradiate the laser beam onto a beam shaper, shaping, by the beam shaper, the laser beam into a laser beam spot, and irradiating the shaped laser beam spot onto a border area of the reflective photomask. The border area may include a recess area and an edge area. The shaped laser beam spot may be irradiated onto the recess area at a first energy and is irradiated onto the edge area at an energy less than the first energy.

A laser annealing apparatus in accordance with an embodiment of the disclosure may include a laser source, a collimator, a beam shaper, a projection lens, and a mask stage. The beam shaper may include a blind area, a transparent area at a center of the blind area, and a semitransparent area between the blind area and the transparent area.

A reflective photomask in accordance with an embodiment of the disclosure may include a pattern area, a non-pattern area, and a border area between the pattern area and the non-pattern area. The border area may include a recess area including a top surface lower than a top surface of the pattern area and a top surface of the non-pattern area and an edge area between the pattern area and the recess area. A width of the edge area may be equal to or less than ¹⁄₂₀ of a width of the border area.

A beam shaper in accordance with an embodiment of the disclosure may include a blind area, a transparent area at a center of the blind area, and a semitransparent area between the blind area and the transparent area.

DETAILED DESCRIPTION

Numerical values described herein may be exemplarily assigned as numerical values for obtaining an appropriate effect. Based on various and sufficient experiments, numerical values may be changed and optimized. Therefore, it should not be construed that the technical scope of the disclosure is limited to assigned numerical values.

Figure 1A:
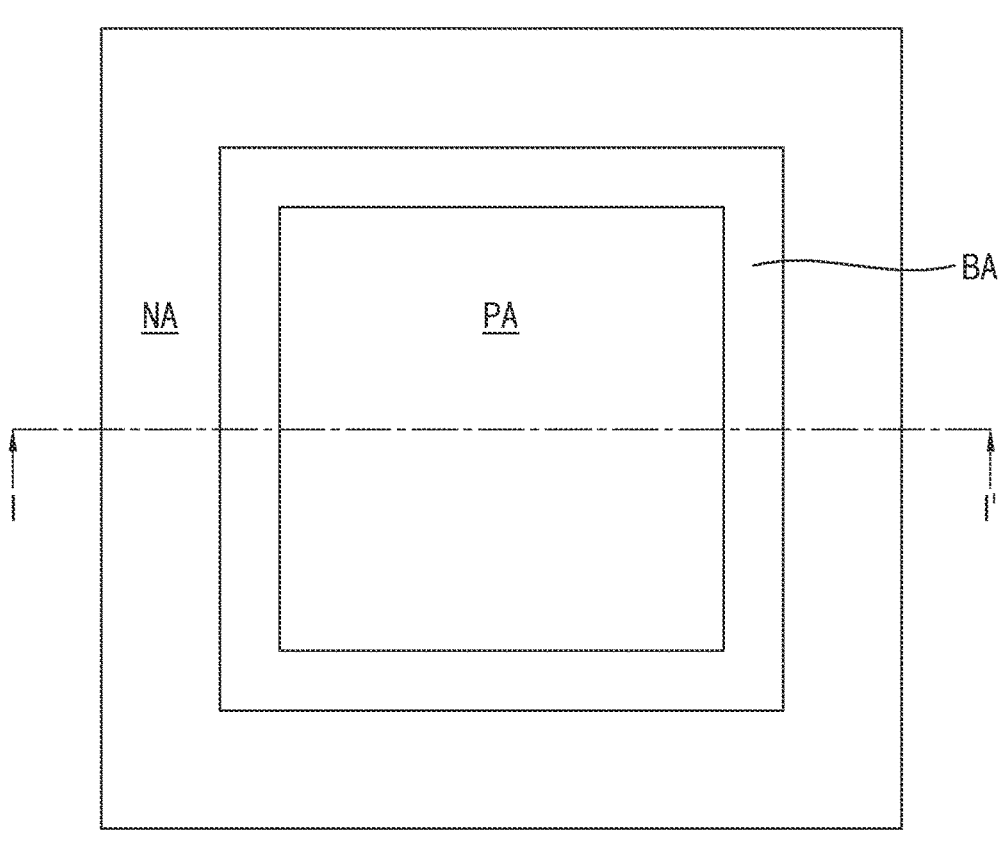
FIG. 1A is a schematic top view of a reflective photomask according to an embodiment of the disclosure.
Figure 1B:
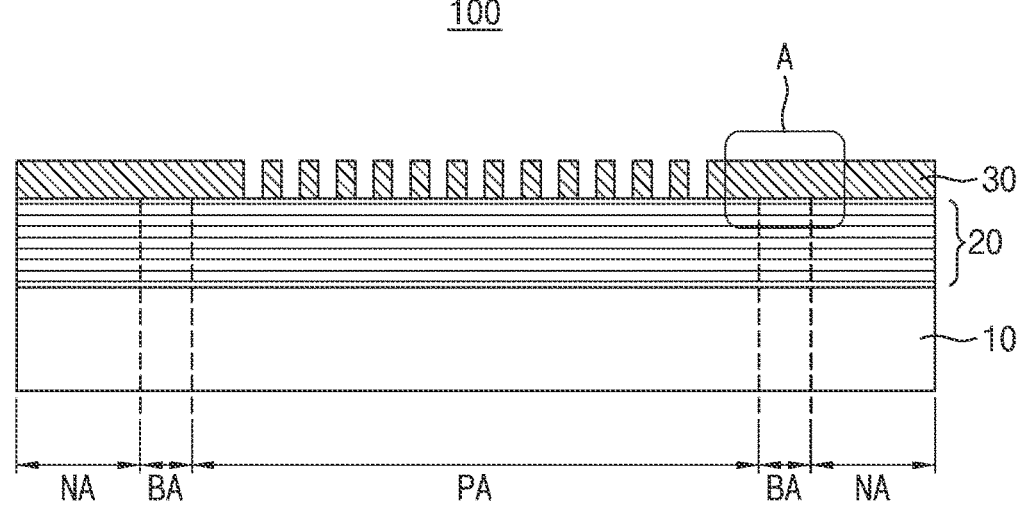
FIG. 1B is a side cross-sectional view of the reflective photomask taken along line I-I' of FIG. 1A.
Figure 1C:
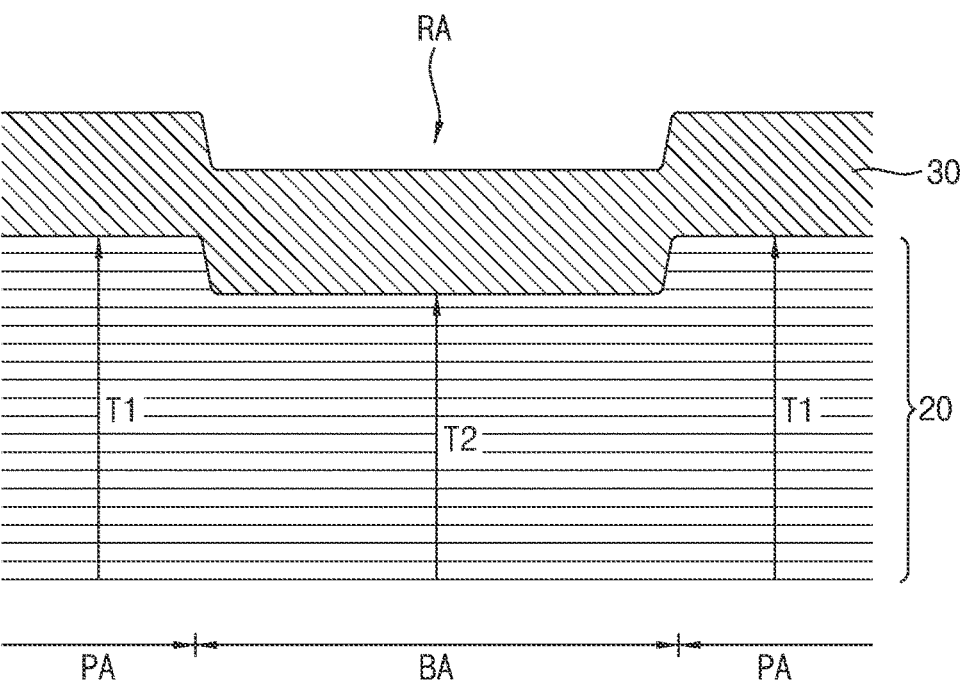
FIG. 1C is an enlarged view of a region A of FIG. 1B.

FIG. 1A is a schematic top view of a reflective photomask 100 according to an embodiment of the disclosure, FIG. 1B is a side cross-sectional view of the reflective photomask 100 taken along line I-I' of FIG. 1A, and FIG. 1C is an enlarged view of a region A of FIG. 1B.

Referring to FIGS. 1A and 1B, in the top view, the reflective photomask 100 according to an embodiment of the disclosure may include a pattern area PA, a non-pattern area NA, and a border area BA between the pattern area PA and the non-pattern area NA, and in the side cross-sectional view, may include a reflection layer 20 and an absorption layer 30, which are stacked on a substrate 10.

The pattern area PA may include various patterns which are to be transferred onto a wafer. For example, the pattern area PA may include a plurality of line and space patterns, a plurality of contact patterns, a plurality of pad patterns, or a plurality of patterns for forming various circuits. Therefore, the absorption layer 30 may include various patterns which selectively expose a surface of the reflection layer 20, in the pattern area PA.

The non-pattern area NA may be an area which is not transferred onto the wafer and may not include a plurality of patterns for forming a circuit. For example, the non-pattern area NA may be covered by the absorption layer 30. In an embodiment, the non-pattern area NA may include a photomask identification (ID), an align pattern, a bar code, a quick response code, or the like.

The border area BA may separate the pattern area PA from the non-pattern area NA. The border area BA, like the non-pattern area NA, may be covered by the absorption layer 30.

The substrate 10 may include a transparent material such as quartz. In an embodiment, the substrate 10 may include a metal component so as to react to static electricity or a magnetic force. Alternatively, in an embodiment, a metal layer may be further formed on a bottom surface of the substrate 10.

The reflection layer 20 may include a plurality of silicon (Si) layers and molybdenum (Mo) layers, which are alternately stacked. A thin metal layer such as ruthenium (Ru) may be formed at an uppermost portion of the reflection layer 20.

The absorption layer 30 may include a material which is opaque and is low in reflectance, with respect to extreme ultraviolet (EUV) light. For example, the absorption layer 30 may include tantalum nitride/oxide, chromium nitride/oxide, titanium nitride/oxide, or other various metal nitrides and metal oxides.

Referring to FIG. 1C, a top surface of the absorption layer 30 in the border area BA may be recessed with respect to a top surface of the absorption layer 30 of each of the pattern area PA and the non-pattern area NA. For example, the border area BA may include a recess area RA. Also, a top surface of the reflection layer 20 in the border area BA may be recessed with respect to a top surface of the reflection layer 20 of each of the pattern area PA and the non-pattern area NA. A thickness T2 of the reflection layer 20 in the border area BA may be less than a thickness T1 of the reflection layer 20 of each of the pattern area PA and the non-pattern area NA. A thickness of the absorption layer 30 in the border area BA may be substantially the same as or similar to a thickness of the absorption layer 30 of each of the pattern area PA and the non-pattern area NA.

Figure 2:
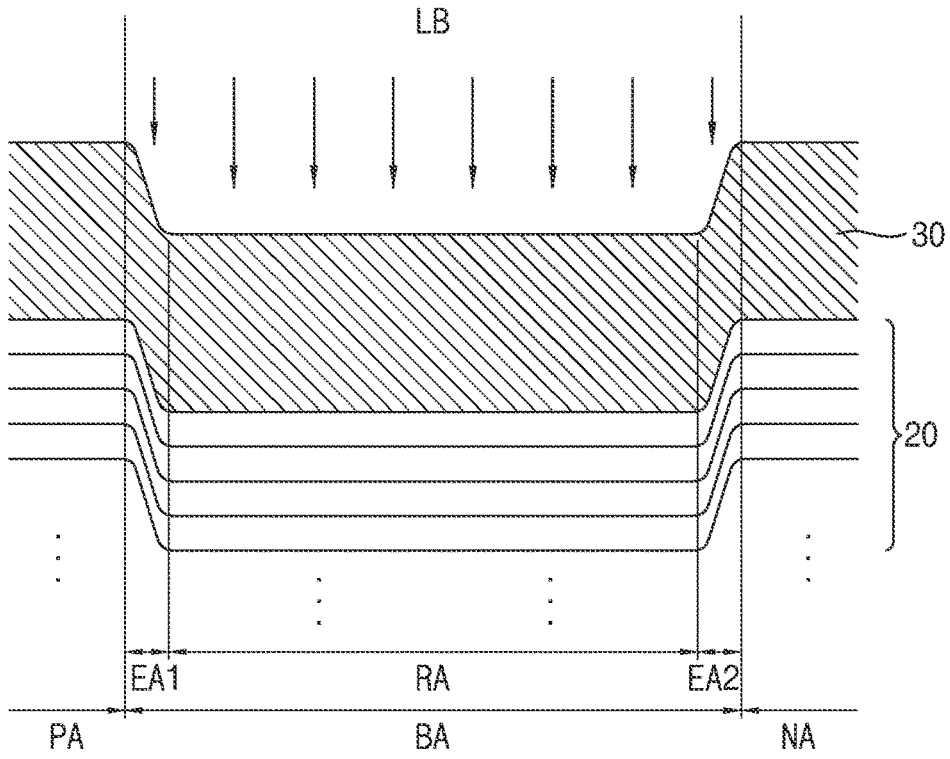
FIG. 2 illustrates a process of forming a recess area by reducing a thickness of the reflection layer in the border area of the reflective photomask.

FIG. 2 illustrates a process of forming a recess area RA by reducing a thickness of the reflection layer 20 in the border area BA of the reflective photomask 100.

Referring to FIG. 2, a process of forming the recess area RA may include a process of irradiating a laser beam LB onto the absorption layer 30 of the border area BA to heat the reflection layer 20. The absorption layer 30 may include a metal material and may be very thin, and thus, heating energy based on the laser beam LB may be easily transferred to the reflection layer 20. A thickness of the heated reflection layer 20 may be reduced. For example, an interval between atoms may decrease. Therefore, the border area BA may include a recess area RA which is substantially flat and a plurality of edge areas EA1 and EA2 which are inclined. The plurality of edge areas EA1 and EA2 may include a first edge area EA1 adjacent the pattern area PA and a second edge area EA2 adjacent the non-pattern area NA. The drawing is illustrated to more easily understand the technical spirit of the disclosure. A recess depth of the absorption layer 30 may be about 30 μm to about 50 μm, and a width of the first edge area EA1 may be about 10 μm or less. That is, unlike the drawing, an inclined angle of each of the edge areas EA1 and EA2 may be small (e.g., relative to vertical).

In an embodiment, a width of the first edge area EA1 may be about 2 μm to about 8 μm. A width of the second edge area EA2 may be less than about 10 μm. In an embodiment, a width of the second edge area EA2 may be about 2 μm to about 8 μm. In an embodiment, a width of the second edge area EA2 may be more or greater than about 5 μm. In an embodiment, a width of the second edge area EA2 may be more or greater than about 10 μm.

Figure 3A:
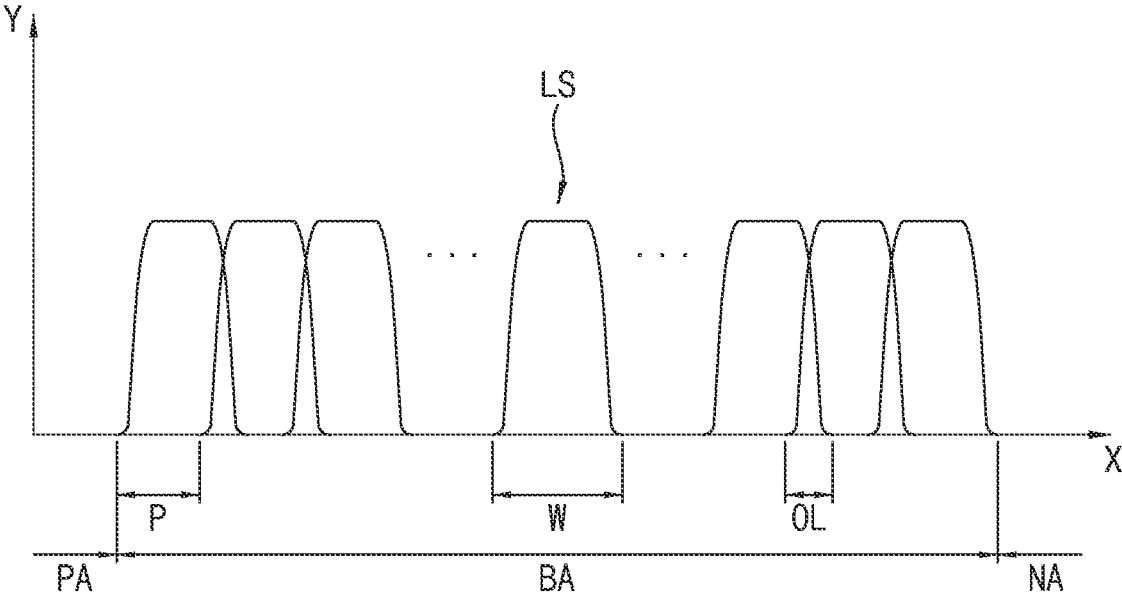
FIGS. 3A to 3C illustrate a method of irradiating a laser beam according to an embodiment of the disclosure.
Figure 3B:
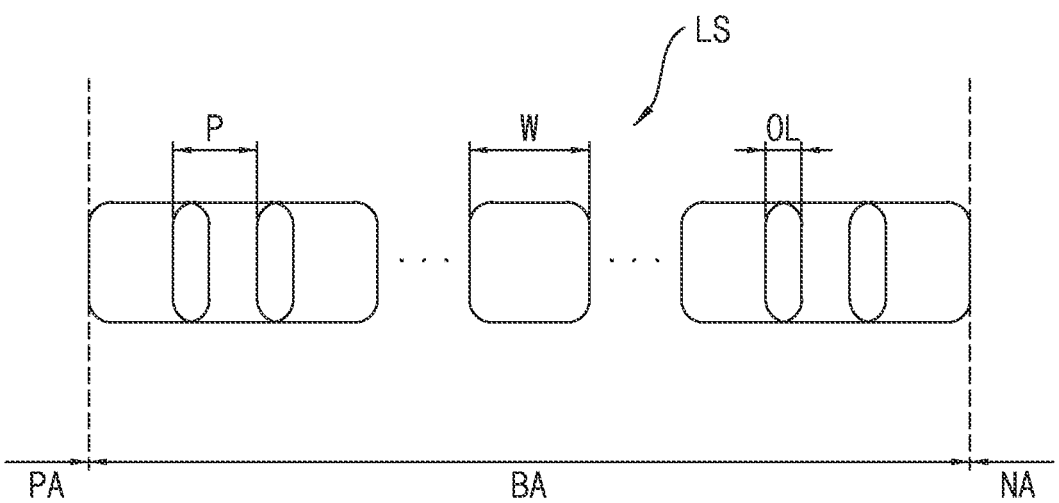
Figure 3C:
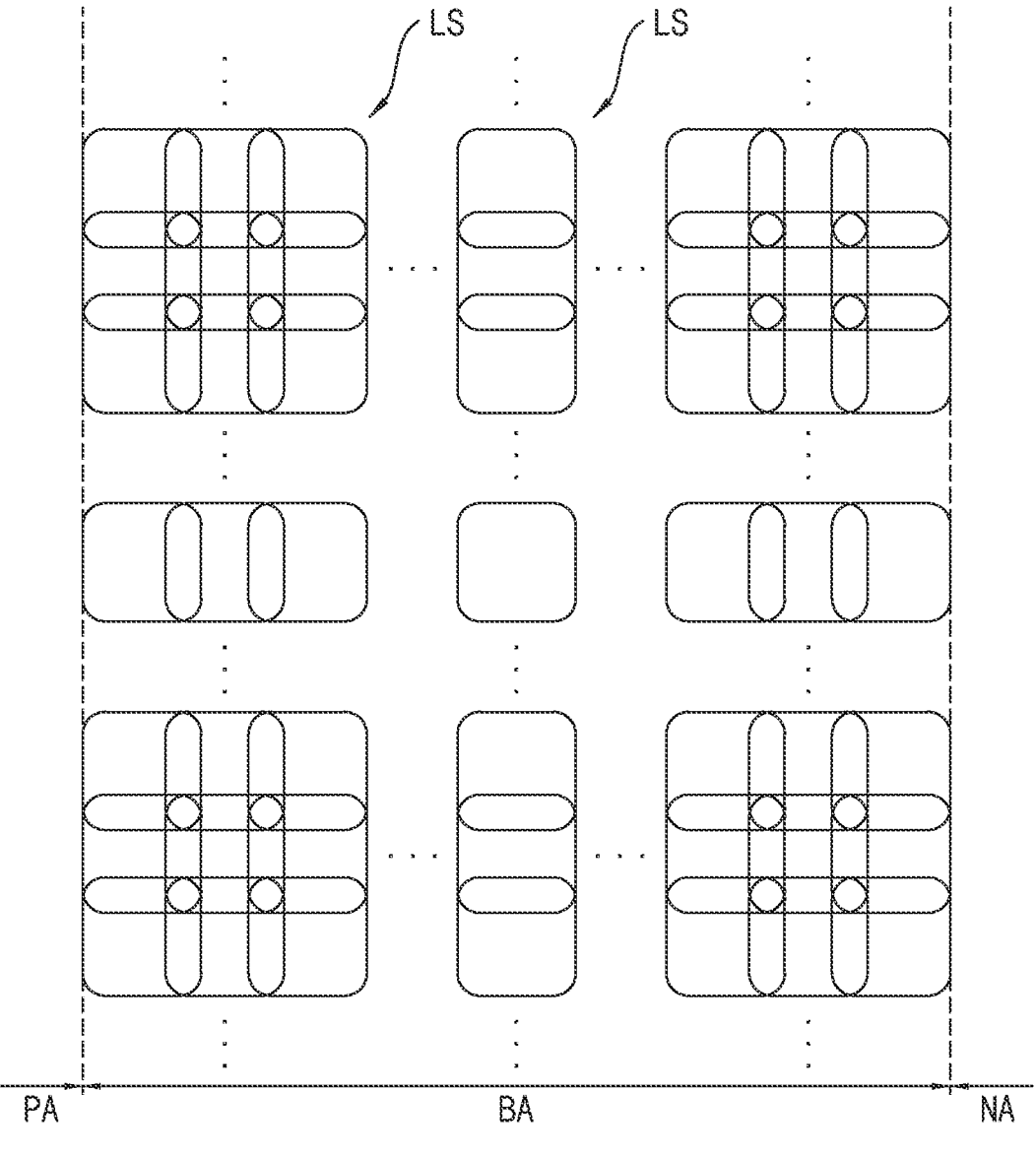

FIGS. 3A to 3C illustrate a method of irradiating a laser beam LB according to an embodiment of the disclosure. An X axis is a position in the border area BA of the reflective photomask 100, and a Y axis is an energy level of each of a plurality of laser beam spots LS. A plurality of laser beam spots may constitute one laser beam LB. Referring to FIGS. 3A to 3C, the method of irradiating the laser beam LB according to an embodiment of the disclosure may include a process of split-irradiating the plurality of laser beam spots LS onto the border area BA.

A width W of each of the plurality of laser beam spots LS may be about 50 μm to about 400 μm. In an embodiment, the width W of each laser beam spot LS may be about 190 μm. Herein, the width W of each laser beam spot LS is an example value applied to an experiment. That is, the width W of each laser beam spot LS may be variously adjusted based on various experiments and environments. However, it may be recommended that the width W of each laser beam spot LS is adjusted to about ⅕ to about 1/20 of a width of the border area BA. In an embodiment, the width W of each laser beam spot LS may be equal to or less than 1/10 of a width of the border area BA. For example, when a width of the border area BA is 2 mm, the width W of each laser beam spot LS may be about 200 μm or less.

A split pitch P of the plurality of laser beam spots LS may be less than the width W of each laser beam spot LS (P<W). That is, the plurality of laser beam spots LS may partially overlap each other. For example, the split pitch P of the plurality of laser beam spots LS may be about 0.5 to 0.9 times the width W of each laser beam spot LS (0.5 W≤P≤0.9 W). In an embodiment, the split pitch P of the plurality of laser beam spots LS may be about 0.75 times the width W of each laser beam spot LS (P=0.75 W). In an embodiment, the split pitch P of the plurality of laser beam spots LS may be about 50 μm to about 200 μm. In a specific embodiment, the split pitch P of the plurality of laser beam spots LS may be about 140 μm. Therefore, an overlap width OL of the plurality of laser beam spots LS may be about 0.1 to 0.5 times the width W of each laser beam spot LS (0.1 W≤OL≤0.5 W). In an embodiment, the overlap width OL of the plurality of laser beam spots LS may be about 0.25 times the width W of each laser beam spot LS (OL≈0.25 W). The width W of each laser beam spot LS may include a length of one side or a diameter of a corresponding laser beam spot LS. The split pitch P of the plurality of laser beam spots LS may include a distance between start points or end points of adjacent laser beam spots LS. The overlap width OL of the plurality of laser beam spots LS may include a distance between a start point of a next laser beam spot LS and an end point of a previous laser beam spot LS or a distance between an end point of the previous laser beam spot LS and a start point of the next laser beam spot LS among adjacent laser beam spots LS.

In an embodiment, an energy profile of the plurality of laser beam spots LS may have a top hat shape instead of a Gaussian shape. That is, the energy profile of the plurality of laser beam spots LS may have a flat top surface and an inclined top surface. For example, the plurality of laser beam spots LS may have a uniform high energy level at a middle portion thereof and may have an energy profile which increases progressively from a low level to a high level or decreases progressively from a high level to a low level at opposite side end edges.

FIGS. 3B and 3C illustrate a method of irradiating a laser beam LB according to an embodiment of the disclosure. Referring to FIGS. 3B and 3C, a laser beam spot LS may have a rectangular shape, and for example, may have a square shape. Corners of a plurality of laser beam spots LS may be round. Referring further to FIG. 3C, a plurality of laser beam spots LS may partially overlap each other in a row direction and a column direction. Referring further to FIG. 3A, a plurality of laser beam spots LS may each have a spot width W of about 50 μm to about 500 μm, may have a split pitch P which is about 0.5 to 0.9 times the spot width W, and may have an overlap width OL which is about 0.1 to 0.5 times the spot width W. As described above, assigned numerical values may be experimental numerical values, and thus, more appropriate numerical values may be optimized through various experiments and may be assigned.

Figure 4A:
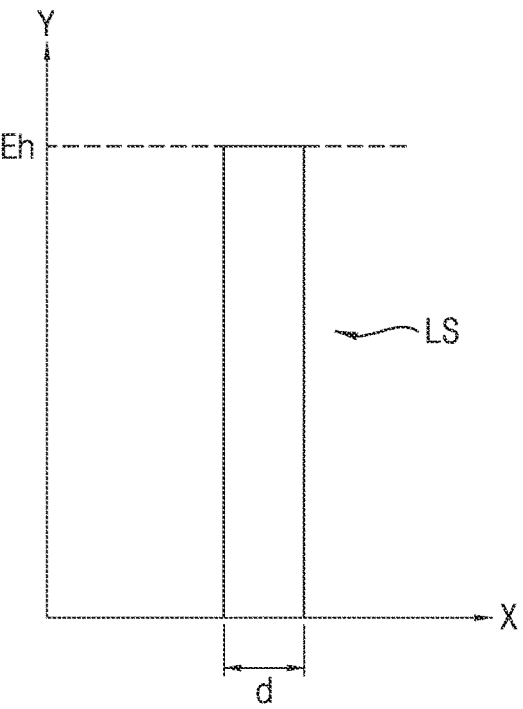
FIG. 4A conceptually illustrates an ideal energy profile with respect to a time of a laser beam spot.

FIG. 4A conceptually illustrates an ideal energy profile with respect to a time of a laser beam spot LS. An X axis is a time, and a Y axis is an energy level. Referring to FIG. 4A, an energy profile with respect to a time of the laser beam spot LS may have a single pulse shape. That is, the laser beam spot LS may be irradiated onto the same position only once. A duration d of a pulse of the laser beam spot LS may be about 10 μs or less. In an embodiment, the duration d of the pulse may be about 10 ns to about 10 μs. In an embodiment, the duration d of the pulse may be about 200 ns. In various embodiments, the duration d of the pulse may decrease to about 10 ns or less. A duration d of a pulse of a laser beam spot LS applied to an experiment is about 10 μs, and a maximum energy level Eh (i.e., a maximum power Eh) thereof is about 0.016 W. In various experiments, when energy is insufficient, the reflection layer 20 is not sufficiently reduced, and when energy is excessive, a crack may occur, whereby the duration d of the pulse and the maximum power Eh of the laser beam spot LS may be appropriately adjusted and selected.

Figure 4B:
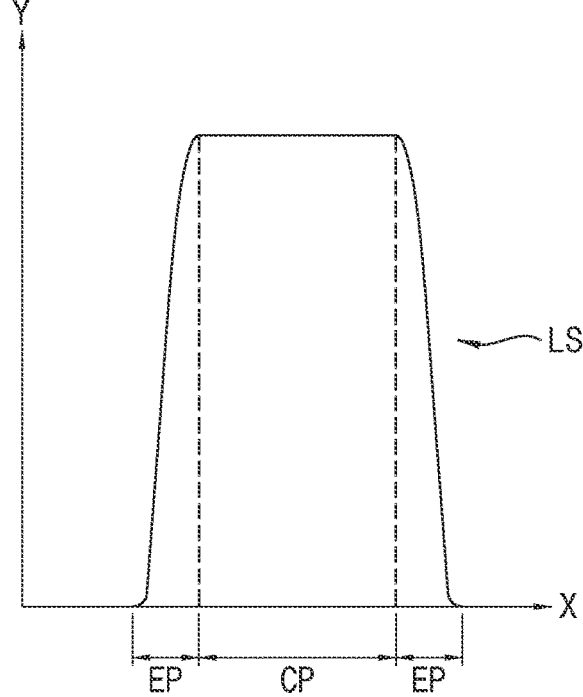
FIG. 4B conceptually illustrates an energy profile with respect to a distance of a laser beam spot.

FIG. 4B conceptually illustrates an energy profile with respect to a distance of a laser beam spot LS. An X axis is a distance, and a Y axis is an energy level. Referring to FIG. 4B, the laser beam spot LS may have a top hat shape. In detail, the laser beam spot LS may include a center portion CP having a relatively uniform energy profile and an edge portion EP having an inclined energy profile. In other words, the energy at each edge portion EP may increase from zero at an outer edge thereof to the uniform energy at the center portion CP. A width of the center portion CP may be about 100 μm to about 200 μm. In an embodiment, a width of the center portion CP may be about 170 μm. A width of the edge portion EP may be about 5 μm to about 50 μm. In an embodiment, a width of the edge portion EP may be about 10 μm. The center portion CP may be a region where a transmittance is not adjusted, and the edge portion EP may be a region where a transmittance is adjusted.

Figure 5A:
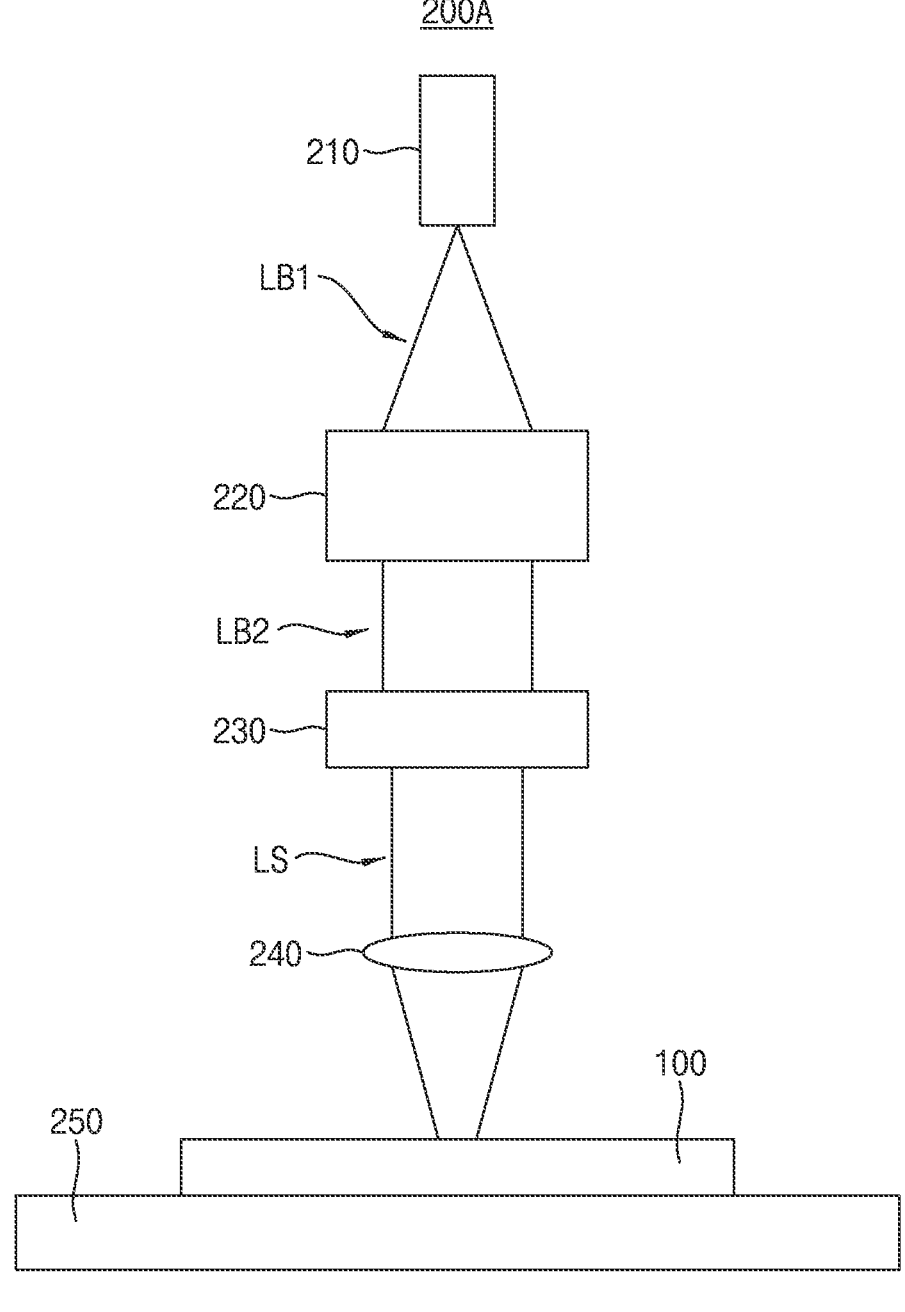
FIGS. 5A to 5C conceptually illustrate a plurality of laser annealing apparatuses according to embodiments of the disclosure.
Figure 5B:
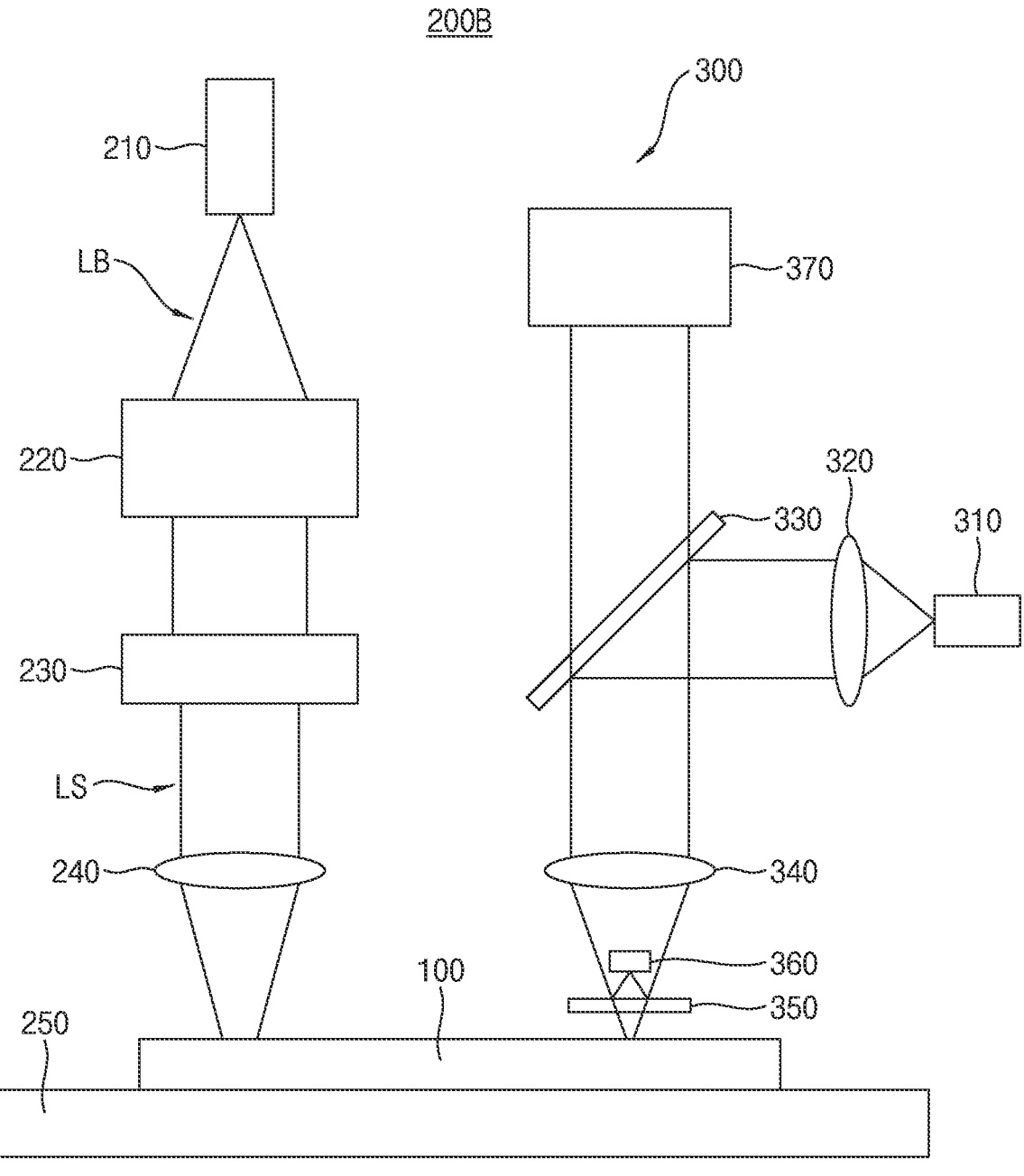
Figure 5C:
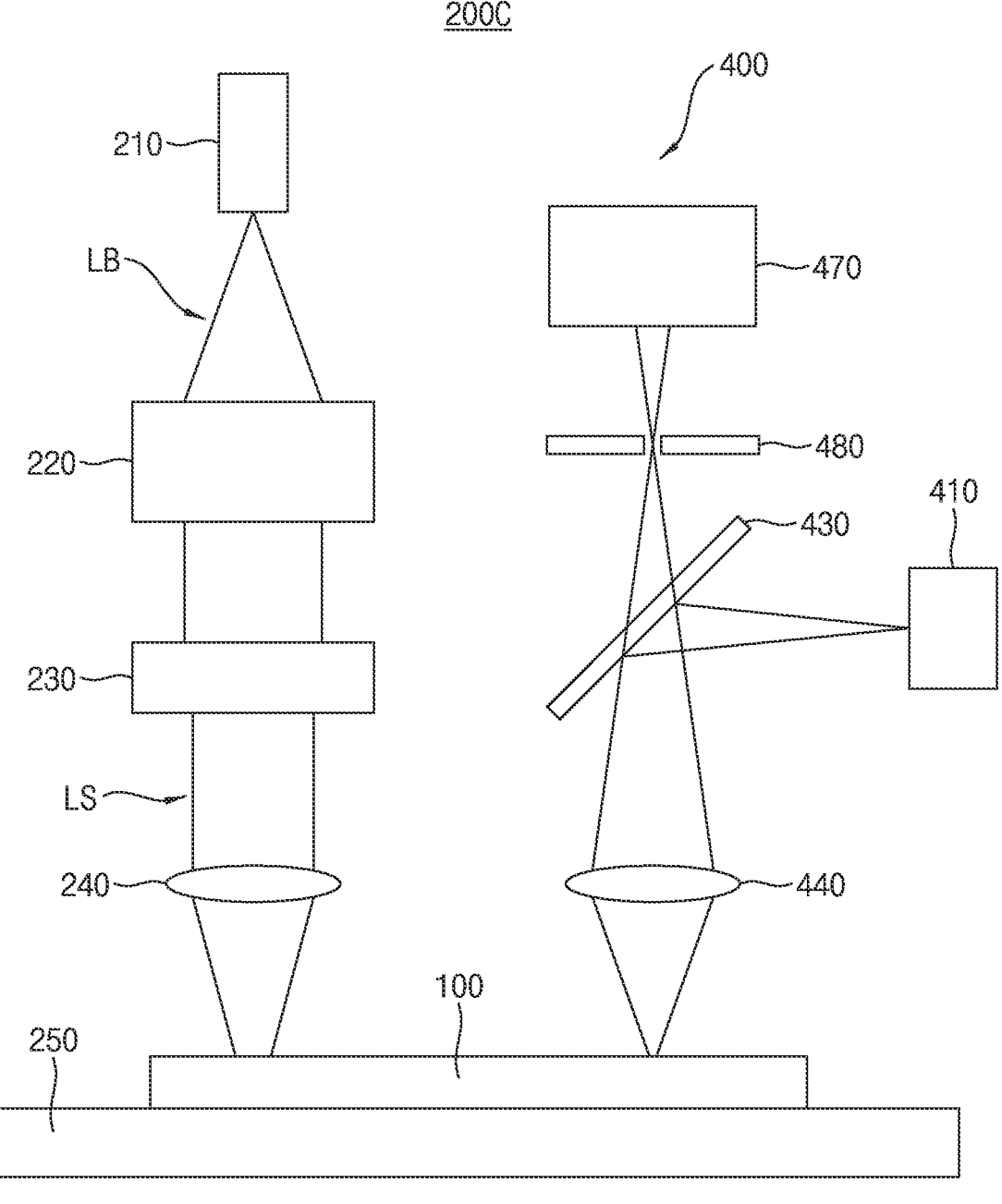

FIGS. 5A to 5C conceptually illustrate a plurality of laser annealing apparatuses 200A to 200C according to embodiments of the disclosure.

Referring to FIG. 5A, the laser annealing apparatus 200A according to an embodiment of the disclosure may include a laser source 210, a collimator 220, a beam shaper 230, a projection lens 240, and a stage 250. A reflective photomask 100 may be disposed on the stage 250.

The laser source 210 may generate an ultraviolet (UV) laser beam LB and may irradiate the UV laser beam LB onto the collimator 220. An energy profile based on a position of a first laser beam LB1 irradiated from the laser source 210 may have a Gaussian profile. The laser beam LB may include various laser beams LB having a wavelength of about 190 nm to about 1,110 nm. In an embodiment, the laser beam LB may have a wavelength which is shorter than 190 nm.

The collimator 220 may primarily shape the laser beam LB irradiated from the laser source 210 and may transfer the primarily-shaped laser beam LB to the beam shaper 230. For example, an energy profile of a second laser beam LB2 passing through the collimator 220 may have a top hat shape. The second laser beam LB2 passing through the collimator 220 may have linearity. A spot shape (i.e., an illumination area) of the second laser beam LB2 passing through the collimator 220 may be circular.

The beam shaper 230 may secondarily shape the second laser beam LB2 and may transfer the secondarily-shaped second laser beam LB2 to the projection lens 240. For example, a center area of the second laser beam LB2 may be selected and shaped into a laser beam spot LS. In an embodiment, a spot shape (i.e., an illumination area) of the laser beam spot LS passing through the beam shaper 230 may be rectangular (see FIGS. 3B and 3C). The beam shaper 230 may adjust an energy level of an energy area of the laser beam spot LS. For example, the beam shaper 230 may shape an energy profile of an edge portion of the laser beam spot LS to be inclined.

The projection lens 240 may irradiate the laser beam spot LS onto a border area BA of the reflective photomask 100.

The stage 250 may move so that the laser beam spot LS is irradiated onto a desired area of the reflective photomask 100. For example, the stage 250 may move in a first horizontal direction and a second horizontal direction and may be raised and lowered in a vertical direction. The first horizontal direction may be a forward-backward direction, and the second horizontal direction may be a left-right direction. Therefore, the first horizontal direction and the second horizontal direction may be perpendicular to each other. In addition, the stage 25 may be inclined.

A method of annealing a border area BA of the reflective photomask 100 according to an embodiment of the disclosure may include a process of placing the reflective photomask 100 on the stage 250, a process of aligning the laser beam spot LS and the reflective photomask 100 by moving the stage 250, and a process of irradiating the laser beam spot LS onto the border area BA of a reflective photomask 100. The method may include a process of moving the stage 250 with the reflective photomask 100 placed thereon in a forward-backward direction and a left-right direction. Therefore, the method may include a process of alternately repeating an operation of moving the stage 250 and an operation of irradiating the laser beam spot LS.

Referring to FIG. 5B, the laser annealing apparatus 200B according to an embodiment of the disclosure may include a laser source 210, a collimator 220, a beam shaper 230, a projection lens 240, a stage 250, and a white light interferometer module or system 300. The white light interferometer module 300 may include a white light source 310, a condensing lens 320, a dichroic mirror 330, an objective lens 340, a beam splitter 350, an objective mirror 360, and a camera 370. White light irradiated from the white light source 310 may pass through the condensing lens 320, the dichroic mirror 330, the objective lens 340, and the beam splitter 350 and may be irradiated onto a surface of a photomask 100 and may include first reflected light which is reflected from the surface of the photomask 100 and is received by the camera 370 and second reflected light which is reflected from the beam splitter 350 and the objective lens 360 and is received by the camera 370. The white light interferometer module 300 may analyze an interference relationship between the first reflected light and the second reflected light to measure a surface profile of the photomask 100. That is, a recess depth of a recess area RA of a border area BA and a gradient and a width of each of a plurality of edge areas EA1 and EA2 in the photomask 100 may be measured. Therefore, by using the white light interferometer module 300, whether the border area BA of the photomask 100 is appropriately recessed may be determined in real time.

Referring to FIG. 5C, the laser annealing apparatus 200C according to an embodiment of the disclosure may include a laser source 210, a collimator 220, a beam shaper 230, a projection lens 240, a stage 250, and a confocal microscopy module or system 400. The confocal microscopy module 400 may include a dot light source 410, a dichroic mirror 430, an objective lens 440, a pin hole blind 480, and a camera 470. Light irradiated from the dot light source 410 may pass through the dichroic mirror 430 and the objective lens 440, may be irradiated onto a surface of a photomask 100, may be reflected from the surface of the photomask 100, may pass through the pin hole blind 480, and may be received by the camera 470. When a border area BA of the photomask 100 is appropriately recessed, light reflected from the border area BA of the photomask 100 may pass through the pin hole blind 480 and may be received by the camera 470. However, when the border area BA of the photomask 100 is not appropriately recessed, the light reflected from the border area BA of the photomask 100 may not pass through the pin hole blind 480. Therefore, by using the confocal microscopy module 400, whether the border area BA of the photomask 100 is appropriately recessed may be determined in real time.

Figure 6A:
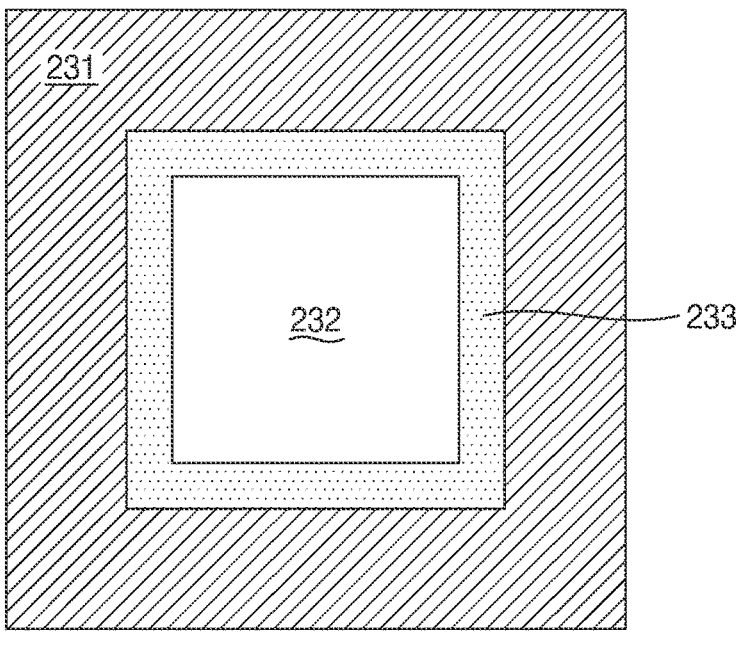
FIGS. 6A and 6B are top views conceptually illustrating a plurality of beam shapers according to embodiments of the disclosure.
Figure 6B:
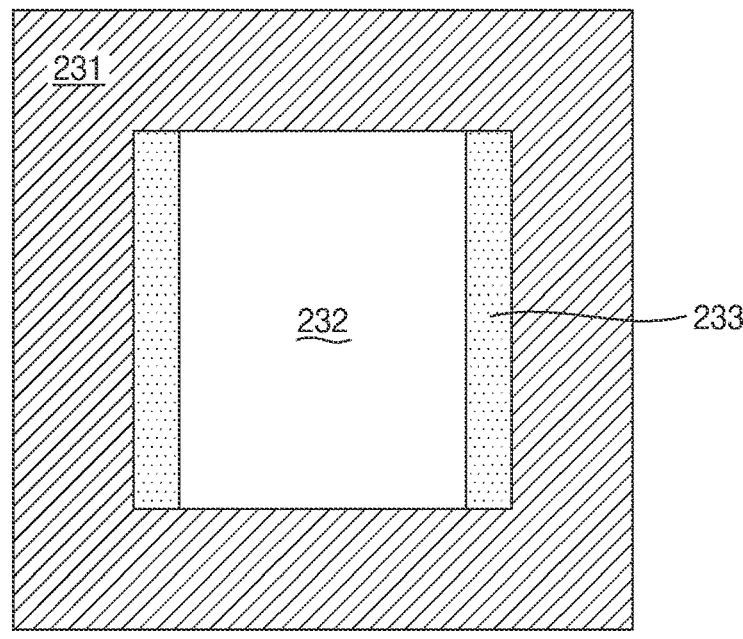

FIGS. 6A and 6B are top views conceptually illustrating a plurality of beam shapers 230A and 230B according to embodiments of the disclosure.

Referring to FIGS. 6A and 6B, the beam shaper 230A according to an embodiment of the disclosure may include a blind area 231, a transparent area 232, and a semitransparent area 233. The transparent area 232 may be disposed at a center of the blind area 231. The semitransparent area 233 may be disposed between the blind area 231 and the transparent area 232. The blind area 231 may include metal and may be opaque. The blind area 231 may block a laser beam LB. The transparent area 232 may be an empty space, or may include a transparent material such as quartz. The semitransparent area 233 may adjust a local transmittance of the laser beam LB. For example, the semitransparent area 233 may adjust a transmittance of light to about 1% to about 99%. The transparent area 232 and the semitransparent area 233 may shape a laser beam spot LS. Therefore, a plurality of laser beam spots LS may each include a center area where a transmittance is not adjusted and an edge area where a transmittance is adjusted.

Referring to FIG. 6A, the transparent area 232 may have a rectangular shape, and the semitransparent area 233 may have a frame shape surrounding the transparent area 232.

Referring to FIG. 6B, the transparent area 232 may have a rectangular shape, and the semitransparent area 233 may have a bar or segment shape disposed at both sides (e.g., opposite sides) of the transparent area 232.

The transparent area 232 and the semitransparent area 233 may shape one laser beam spot LS. The semitransparent area 233 may adjust a transmittance of the laser beam LB to define inclined portions of both sides of the laser beam spot LS illustrated in FIG. 3A. In an embodiment, a width of the semitransparent area 233 may be about 3 μm to about 20 μm. In an embodiment, a width of the semitransparent area 233 may be about 5 μm.

FIGS. 7A to 7E are top views conceptually illustrating a plurality of beam shapers 230A and 230B according to various embodiments of the disclosure. For example, a semitransparent area 233 is enlarged and illustrated.

Referring to FIGS. 7A to 7E, semitransparent areas 233 of the plurality of beam shapers 230A and 230B may adjust a transmittance of a laser beam LB to locally lower an energy level. For example, an energy profile of the edge portion EP of the laser spot LS illustrated in FIG. 4B may be provided. As described above, the transparent area 232 may be an empty space, namely, an open area. The semitransparent areas 233 of the plurality of beam shapers 230A and 230B may have a transparency gradient. For example, the semitransparent areas 233 may have high transparency toward the transparent area 232 and may have low transparency toward the blind area 231. In other words, the semitransparent areas 233 may increase in transparency from the blind area 231 toward the transparent area 232. In an embodiment, the semitransparent areas 233 of the beam shapers 230A and 230B may have an opening gradient. For example, the semitransparent areas 233 of the plurality of beam shapers 230A and 230B may include a wide opening toward the transparent area 232 and may include a narrow opening toward the blind area 231. In an embodiment, the semitransparent areas 233 may have a high opening rate toward the transparent area 232 and may have a low opening rate toward the blind area 231. The semitransparent areas 233 may have a transparency variation, a transmittance variation, an opening variation, or an opening rate variation, which is performed at least three times.

Figure 7A:
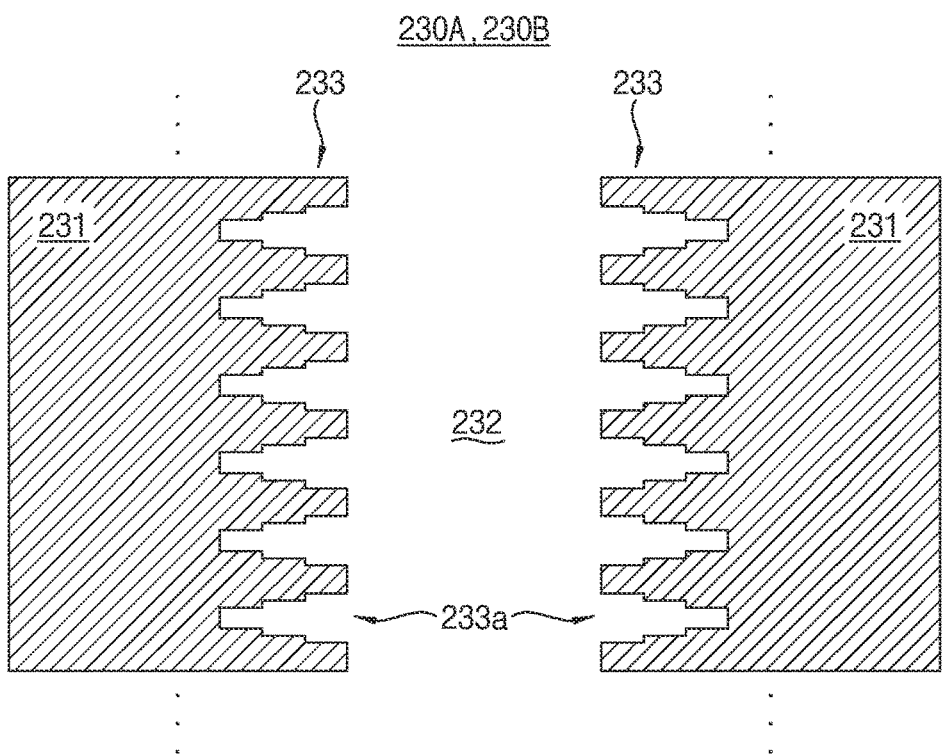
FIGS. 7A to 7E are top views conceptually illustrating a plurality of beam shapers according to various embodiments of the disclosure. For example, a semitransparent area is enlarged and illustrated.

Referring to FIG. 7A, a semitransparent area 233 of each of a plurality of beam shapers 230A and 230B according to an embodiment of the disclosure may include a plurality of cut-out portions 233a having a staircase or stepped shape. The cut-out portions 233a may be widened toward a transparent area 232 and may be narrowed toward an inner portion of a blind area 231. In other words, the cut-out portions 233a may widen from the blind area 231 toward the transparent area 232. Therefore, the semitransparent area 233 may provide an energy profile of an edge portion of the laser beam spot LS, which is relatively high toward the transparent area 232 and is relatively low toward the blind area 231.

Figure 7B:
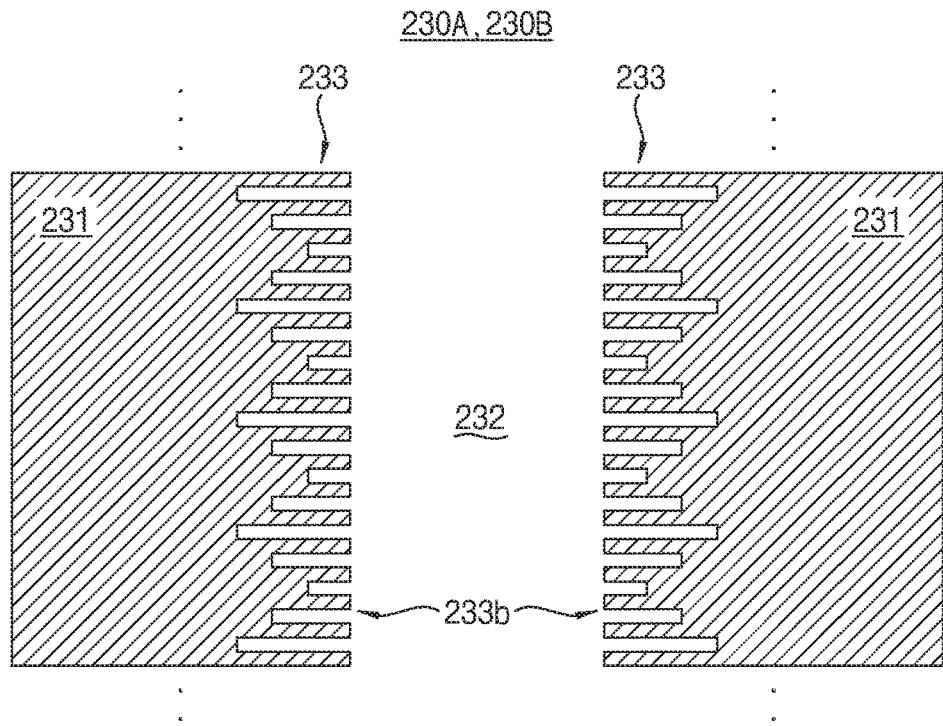

Referring to FIG. 7B, a semitransparent area 233 of each of a plurality of beam shapers 230A and 230B according to an embodiment of the disclosure may include a plurality of cut-out portions 233b having a slit shape. The plurality of cut-out portions 233b having a slit shape may have various widths or various lengths. For example, the semitransparent area 233 may include more cut-out portions 233b toward or adjacent a transparent area 232 and may include fewer cut-out portions 233b toward or further within a blind area 231. Accordingly, energy of the laser beam spot LS may be high toward the transparent area 232 and may be low toward the blind area 231.

Figure 7C:
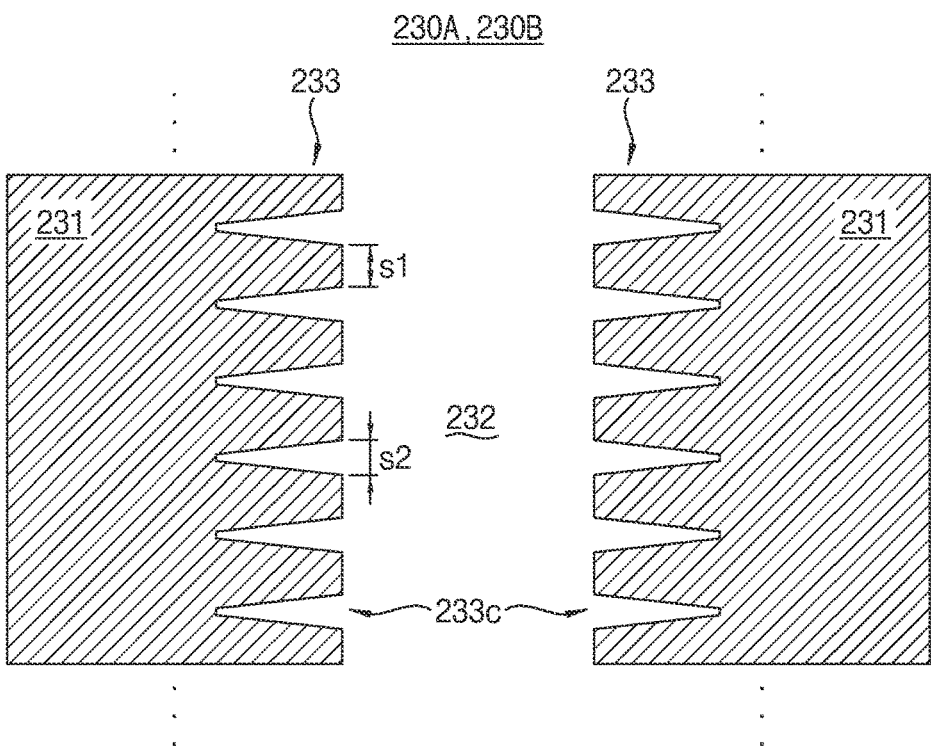

Referring to FIG. 7C, a semitransparent area 233 of each of a plurality of beam shapers 230A and 230B according to an embodiment of the disclosure may include a plurality of cut-out portions 233c having a funnel shape. An interval between the plurality of cut-out portions 233c having a funnel shape may be widened toward a transparent area 232 and may be narrowed toward a blind area 231. In other words, the cut-out portions 233c may widen from the blind area 231 toward the transparent area 232. A minimum interval s1 between adjacent funnel shapes may be greater than a maximum width s2 of the funnel shape. Accordingly, the mechanical stability of the beam shapers 230A and 230B may be enhanced, and an optical transmittance may be easily adjusted.

Figure 7D:
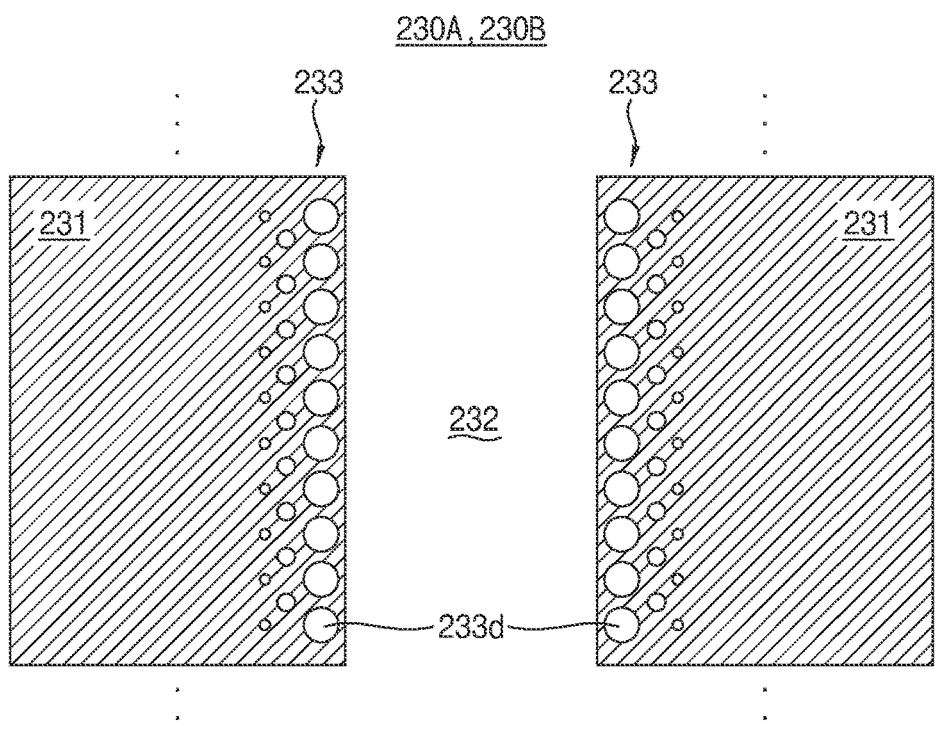

Referring to FIG. 7D, a semitransparent area 233 of each of a plurality of beam shapers 230A and 230B according to an embodiment of the disclosure may include a plurality of cut-out portions 233d having a hole shape. A diameter of each of a plurality of holes may be relatively large toward a transparent area 232 and may be relatively small toward a blind area 231.

In the beam shapers 230A and 230B illustrated in FIGS. 7A to 7D, the semitransparent areas 233 may include a plurality of portions blocking light and a plurality of portions transmitting the light. In an embodiment, each of the semitransparent areas 233 may be a portion of the blind area 231.

Figure 7E:
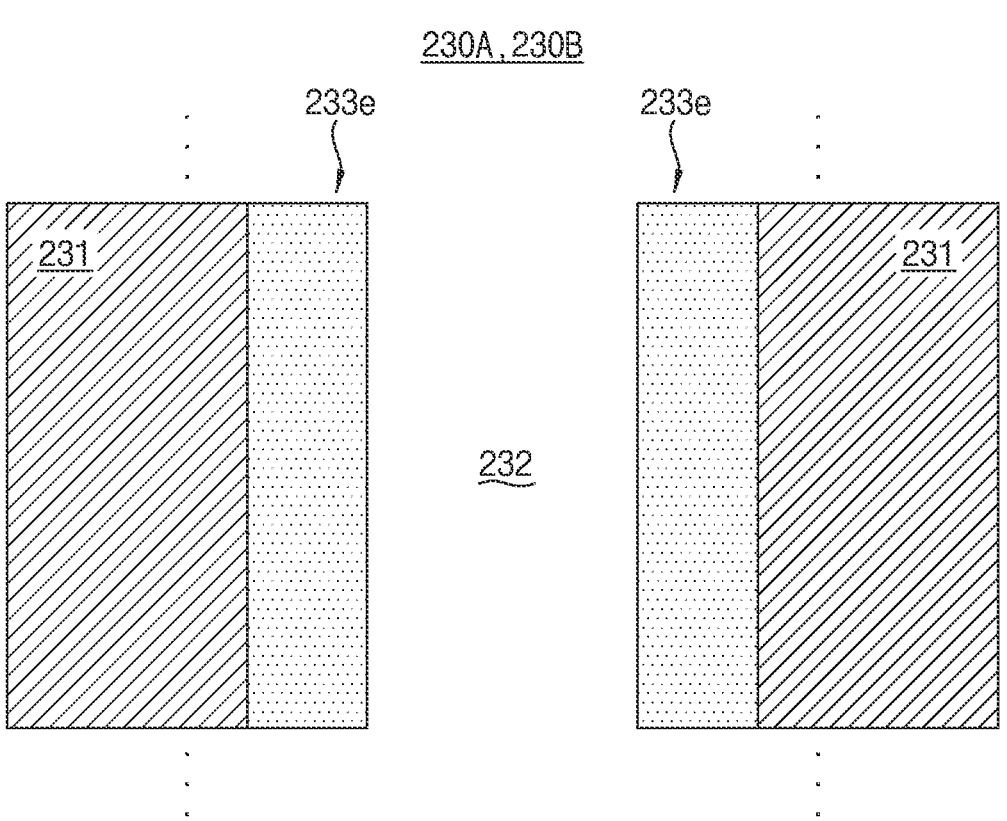

Referring to FIG. 7E, a semitransparent area 233e of each of a plurality of beam shapers 230A and 230B according to an embodiment of the disclosure may include a semitransparent material layer. For example, the semitransparent material layer may include coated quartz, impurities-containing quartz, semitransparent metal, and/or the like. A coated material or impurities may include silicon or a metal-based material such as aluminum, chromium, molybdenum, titanium, tantalum, tungsten, or ruthenium.

FIGS. 8A to 8D are side cross-sectional views conceptually illustrating a plurality of beam shapers 230 according to embodiments of the disclosure.

Figure 8A:
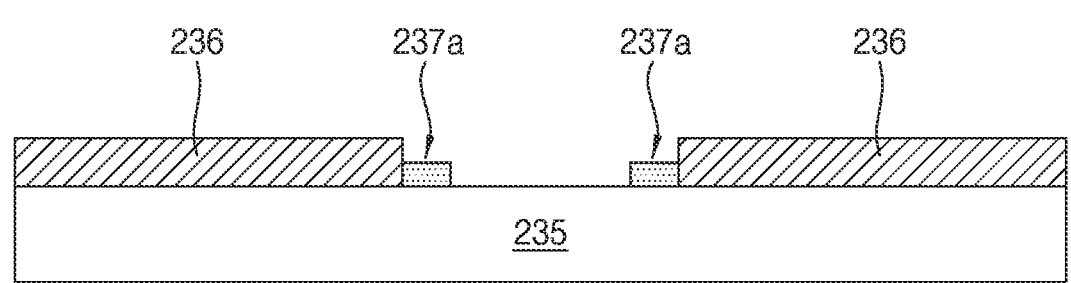
FIGS. 8A to 8D are side cross-sectional views conceptually illustrating a plurality of beam shapers according to embodiments of the disclosure.

Referring to FIG. 8A, a plurality of beam shapers 230A and 230B according to an embodiment of the disclosure may include a transparent substrate 235, a light blocking layer 236, and a semitransparent layer 237a.

The transparent substrate 235 may include a transparent material such as quartz. The light blocking layer 236 may block a laser beam LB. The light blocking layer 236 and the semitransparent layer 237a may include an opaque material such as metal. The semitransparent layer 237a may be thinner than the light blocking layer 236. The light blocking layer 236 may define a blind area 231, and the semitransparent layer 237a may define a semitransparent area 233.

Figure 8B:
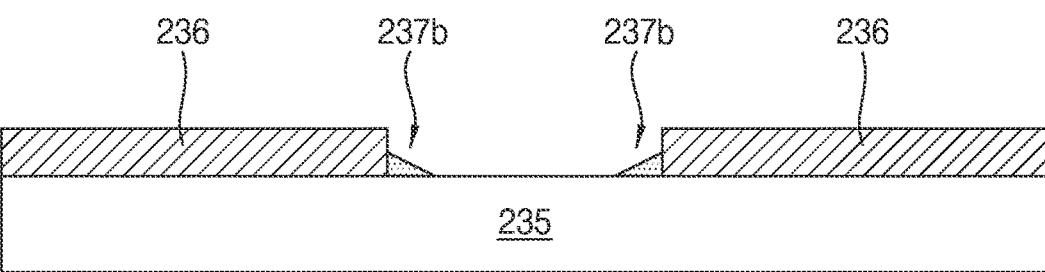

Referring to FIG. 8B, a plurality of beam shapers 230A and 230B according to an embodiment of the disclosure may include a transparent substrate 235, a light blocking layer 236, and a semitransparent layer 237b. A surface of the semitransparent layer 237b may be inclined (e.g., with respect to a top surface of the transparent substrate 235).

Figure 8C:
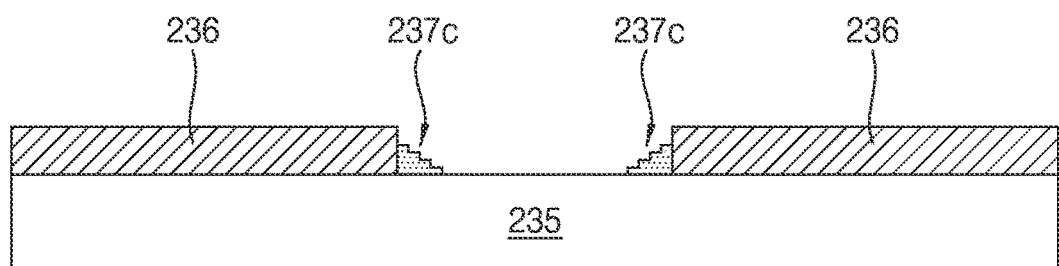

Referring to FIG. 8C, a plurality of beam shapers 230A and 230B according to an embodiment of the disclosure may include a transparent substrate 235, a light blocking layer 236, and a semitransparent layer 237c. A surface of the semitransparent layer 237c may have a staircase shape. The semitransparent layer 237c may be inclined with respect to a top surface of the transparent substrate 235 and may be stepped.

Figure 8D:
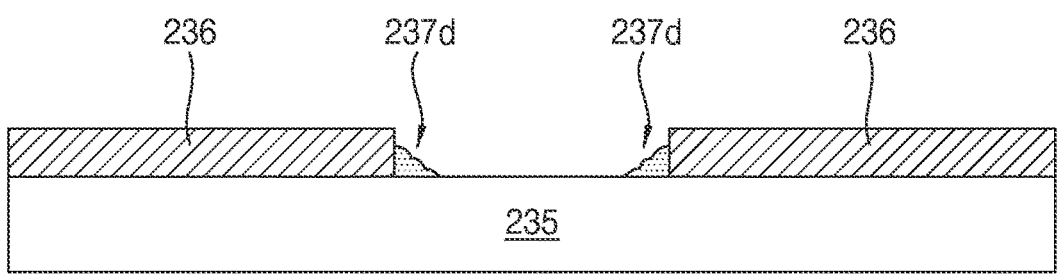

Referring to FIG. 8D, a plurality of beam shapers 230A and 230B according to an embodiment of the disclosure may include a transparent substrate 235, a light blocking layer 236, and a semitransparent layer 237d. A surface of the semitransparent layer 237d may have a smooth slope or a smooth staircase shape. The semitransparent layer 237d may be inclined with respect to a top surface of the transparent substrate 235.

Figure 9:
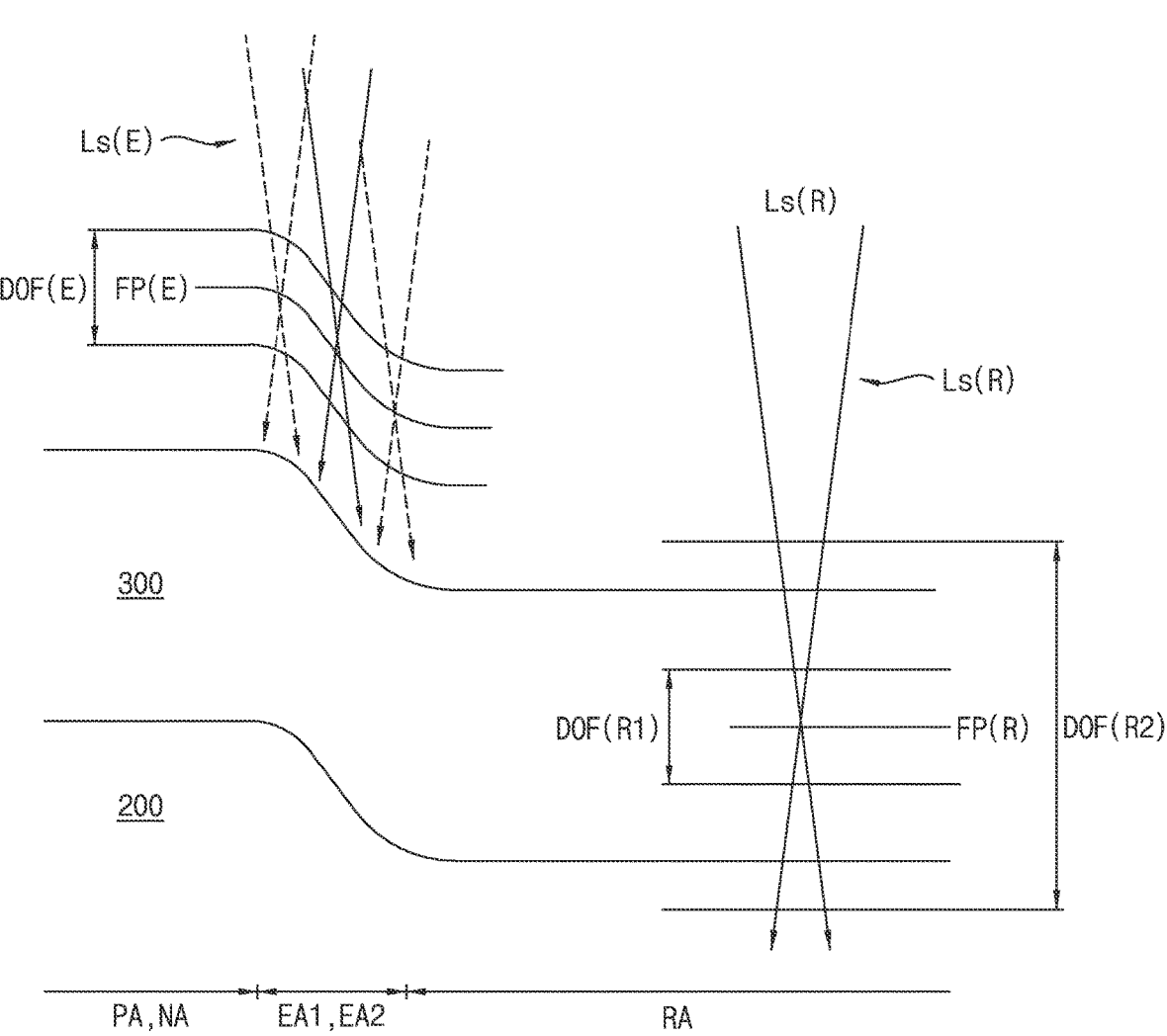
FIG. 9 illustrates a method of irradiating a laser according to embodiments of the disclosure.

FIG. 9 illustrates a method of irradiating a laser according to embodiments of the disclosure. Referring to FIG. 9, the method of irradiating a laser according to embodiments of the disclosure may include a process of adjusting focus planes FP(E) and FP(R) of a plurality of laser beam spots LS. For example, a plurality of laser beam spots LS(R) irradiated onto a recess area RA may be irradiated so that the focus plane FP(R) is placed in an absorption layer 300. In the recess area RA, a plurality of focus depths DOF(R1) and DOF(R2) may be placed in the absorption layer 300, or may be formed to be vertically wider than the absorption layer 300. Therefore, the absorption layer 300 in the recess area RA may receive sufficient laser energy. A plurality of laser beam spots LS(E) irradiated onto an edge area EA may be irradiated so that the focus plane FP(E) is placed at a level which is higher than a surface of the absorption layer 300. In the edge area EA, a focus depth DOF(E) may be placed outside the absorption layer 300. In an embodiment, the focus depth DOF(E) may be placed to partially overlap the absorption layer 300, in the edge area EA. For example, in FIGS. 3B and 3C, a focus plane FP(E) of at least one laser beam spot LS adjacent to the pattern area PA or the non-pattern area NA may be adjusted. Therefore, the absorption layer 300 in the recess area RA may receive heating energy which is higher than the absorption layer 300 in the plurality of edge areas EA1 and EA2. That is, the reflection layer 200 in the recess area RA may be reduced to be thinner than the reflection layer 200 in the plurality of edge areas EA1 and EA2.

The laser annealing method according to the embodiments of the disclosure may recess an absorption layer to have an appropriate gradient in an edge area of a border area of a reflective photomask and may decrease a thickness of a reflection layer.

The laser annealing apparatus according to the embodiments of the disclosure may heat the absorption layer to have an appropriate gradient in the edge area of the border area of the reflective photomask.

Hereinabove, the embodiments of the disclosure have been described with reference to the accompanying drawings, but it may be understood that those skilled in the art may implement the embodiments in another detailed form without changing the inventive concept or the essential features thereof. It should be understood that the embodiments described above are merely examples in all aspects and are not limiting.

What is claimed is:

1. A laser annealing apparatus comprising:
a laser source;
a collimator;
a beam shaper;
a projection lens; and
a mask stage,
wherein the beam shaper comprises a blind area, a transparent area at a center of the blind area, and a semitransparent area between the blind area and the transparent area.

2. The laser annealing apparatus of claim 1, wherein the transparent area has a rectangular shape, and the semitransparent area has a frame shape surrounding the transparent area.

3. The laser annealing apparatus of claim 1, wherein the semitransparent area comprises bars or segments at opposite sides of the transparent area.

4. The laser annealing apparatus of claim 1, wherein the semitransparent area of the beam shaper has a transparency gradient which increases from the blind area toward the transparent area.

5. The laser annealing apparatus of claim 4, wherein the semitransparent area comprises a plurality of cut-out portions each having at least one of a stepped shape, a slit shape, a funnel shape, and a hole shape.

6. The laser annealing apparatus of claim 4, wherein the semitransparent area has a transparency variation at least three times over the semitransparent area.

7. The laser annealing apparatus of claim 1, wherein the beam shaper comprises a light blocking layer defining the blind area and a semitransparent layer defining the semitransparent area.

8. The laser annealing apparatus of claim 7, wherein the beam shaper further comprises a transparent substrate, and the light blocking layer and the semitransparent layer are on the transparent substrate.

9. The laser annealing apparatus of claim 1, wherein
the transparent area is an empty space, and
the semitransparent area comprises a plurality of cut-out portions.

10. A laser annealing apparatus comprising:
a laser source;
a collimator;
a beam shaper;
a projection lens; and
a mask stage,
wherein the laser source generates a laser beam having a pulse shape,
wherein the beam shaper shapes the laser beam into a plurality of laser beam spots,
wherein an energy profile of a center portion of each of the plurality of laser beam spots is flat and has a width of about 100 μm to about 200 μm, and
an energy profile of an edge portion of each of the plurality of laser beam spots is inclined and has a width of about 5 μm to about 50 μm.

11. The laser annealing apparatus of claim 10, wherein the laser beam is irradiated to the beam shaper through the collimator.

12. The laser annealing apparatus of claim 11, wherein an energy profile of the laser beam has a gaussian shape, and an energy profile of each of the plurality of laser beam spots has a top hat shape.

13. The laser annealing apparatus of claim 11, wherein the projection lens irradiates the plurality of laser beam spots onto a border area of a reflective photomask.

14. The laser annealing apparatus of claim 11, wherein a split pitch of the plurality of laser beam spots is less than a width of each of the plurality of laser beam spots.

15. The laser annealing apparatus of claim 14, wherein the split pitch of the plurality of laser beam spots is 0.5 to 0.9 times the width of each of the plurality of laser beam spots.

16. The laser annealing apparatus of claim 11, wherein the plurality of laser beam spots have a pulse shape, and
a duration of a pulse of each of the plurality of laser beam spots is about 10 μs or less.

17. The laser annealing apparatus of claim 11, wherein a spot shape of each of the plurality of the laser beam spots is rectangular.

18. The laser annealing apparatus of claim 11, wherein each of the plurality of laser beam spots comprises a center portion where transmittance is not adjusted and an edge portion where transmittance is adjusted.

19. The laser annealing apparatus of claim 10, wherein the beam shaper shapes an energy profile of an edge portion of the laser beam to be inclined.

* * * * *